(12) United States Patent
Izumi

(10) Patent No.: US 6,650,443 B1
(45) Date of Patent: Nov. 18, 2003

(54) APPARATUS AND METHOD FOR READING IMAGE, AND COMPUTER-READABLE STORAGE MEDIUM STORING IMAGE PROCESSING PROGRAM

(75) Inventor: Yohei Izumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 585 days.

(21) Appl. No.: 09/617,230

(22) Filed: Jul. 14, 2000

(30) Foreign Application Priority Data

Jul. 30, 1999 (JP) .......................................... 11/217798

(51) Int. Cl.$^7$ ...................... H04N 5/253; H04N 5/222; H01L 27/00
(52) U.S. Cl. .................... 358/475; 348/96; 348/370; 250/208.1
(58) Field of Search ................................ 358/475, 483, 358/482; 250/208.1; 348/96, 97, 98, 370, 371, 229.1, 230.1

(56) References Cited

U.S. PATENT DOCUMENTS 5,327,171 A * 7/1994 Smith et al. ............ 348/223.1

FOREIGN PATENT DOCUMENTS

| JP | 10-023252 | 1/1998 |
| JP | 11-187198 | 7/1999 |

* cited by examiner

Primary Examiner—Edward Coles
Assistant Examiner—Jason Sherrill
(74) Attorney, Agent, or Firm—Fitzpatrick, Cella, Harper & Scinto

(57) ABSTRACT

A scanner effectively uses the photoelectric conversion range of a CCD and can determine the individual gains of RGB color channels to adjust gray balance. In order to obtain the advantages, an electric-charge storage time of the CCD is set in such manner that the CCD is not saturated even when the illumination intensity of a lamp is maximized. In this arrangement, a CPU controls an inverter control circuit to change the illumination intensity of the lamp. The CCD is kept sufficiently far from the saturation region, and so the output level of the CCD changes linearly with respect to changes in the illumination intensity. In addition, since the CCD output level obtained when the storage time is set to be the same as that set at the time of scanning can be predicted, the illumination intensity of the lamp can be obtained by calculating an output level at which no saturation occurs in that situation. Furthermore, with the output of a D/A converter, a gain control amplifier (GCA) performs gain control and the analog gains of the RGB color channels are thereby individually obtained so as to keep balance between RGB signals.

6 Claims, 2 Drawing Sheets

RELATIONSHIP BETWEEN CCD PHOTOELECTRIC CONVERSION RANGE
AND AD CONVERTER OUTPUT

APPARATUS AND METHOD FOR READING IMAGE, AND COMPUTER-READABLE STORAGE MEDIUM STORING IMAGE PROCESSING PROGRAM

BACKGROUND OF THE INVENTION

1. Field of the Invention

The present invention relates to apparatuses and methods for reading images, which are suitable for use in image-reading scanners. The invention also relates to computer-readable storage mediums storing image-processing programs.

2. Description of the Related Art

In general, a scanner includes a lamp having a fixed illumination intensity, by which a CCD is not saturated. In this case, the illumination intensity of the lamp, which can prevent the CCD from saturating, is set in such manner that only the lower part of the linear region in a photoelectric conversion range of the CCD is used in consideration for variations in luminance of the lamp. In this case, however, when the luminance of the lamp is smaller than an average, the level of a CCD output signal becomes extremely small. As a result, compensation for decrease in the CCD signal level must be made by increasing an analog gain of the CCD output signal. This leads to degradation of the S/N ratio of a scanned image.

In order to avoid this problem, it is necessary to utilize the linear region in the CCD photoelectric conversion range as much as possible. In this case, according to changes in the variations of CCD sensitivity and changes in one of the transmittance and the reflectance of an original to be scanned, the illumination intensity of the lamp needs to be adjustable over a wide range. However, when a fluorescent tube having a high luminance is used as a light source to be adapted to a negative film which has a wide latitude, it is difficult to change the illumination intensity of the lamp in a wide range and stable condition.

In addition, before inserting the original to be scanned, it is not possible to adjust the illumination intensity to the entire linear region of the CCD photoelectric conversion range while including the transmittance of the original, since saturation of the CCD and saturation of an analog gain of the CCD output signal occur.

As mentioned above, in the conventional scanner having the fixed luminance of the light source, due to the saturation of the CCD, the variations in the CCD sensitivity, and the variations in the light-source luminance, it is necessary to set a low-level illumination intensity with respect to the saturation voltage of the CCD. Therefore, it is difficult to effectively utilize the CDD photoelectric conversion range. As a result, since the CCD output level decreases, in contrast, the analog gain increases to form an image signal. Thus, a satisfactory S/N ratio is difficult to obtain.

In addition, when the scanner performs a self-compensation by controlling the aforementioned analog gain, it is impossible to obtain an analog gain appropriate to adjust a gray balance at a reading time in case the CCD reaches the saturation region.

SUMMARY OF THE INVENTION

Accordingly, in order to solve the above problems, it is an object of the present invention to provide an apparatus and a method for reading an image, and a computer-readable storage medium, in which the photoelectric conversion region of a CCD can effectively be used and the gray balance of individual red, green, and blue color (RGB) signals can be maintained.

According to a first aspect of the present invention, there is provided an image reading apparatus. This apparatus includes a light-source unit for illuminating an original to be read and a photoelectric conversion unit for reading light from the original to convert the light into an image signal. An illumination-intensity controlling unit controls the illumination intensity of the light-source unit. A setting unit sets an electric-charge storage time of the photoelectric conversion unit in a manner that the photoelectric conversion unit is not saturated in a state in which the illumination intensity of the light-source unit is maximized by the illumination-intensity controlling unit. A first determining unit determines the illumination intensity of the light-source unit by controlling the illumination-intensity controlling unit in a state in which the photoelectric conversion unit directly reads the light of the light-source unit after setting of the electric-charge storage time by the setting unit.

According to a second aspect of the present invention, there is provided an image reading apparatus. The apparatus includes a photoelectric conversion unit that reads light from an original to convert the light into an image signal. An amplifying unit amplifies the image signal output from the photoelectric conversion unit. A setting unit sets an electric-charge storage time of the photoelectric conversion unit to be shorter than the storage time set at the time of reading of the original. A determining unit determines an amplification factor of the amplifying unit according to the level of the image signal amplified by the amplified unit after setting of the electric-charge storage time by the setting unit.

According to a third aspect of the present invention, there is provided an image reading method, in which a light-source unit illuminates an original and a photoelectric conversion unit reads light from the original to convert the light into an image signal. The image reading method includes the steps of controlling the illumination intensity of the light-source unit in such a manner to be maximized, setting an electric-charge storage time of the photoelectric conversion unit in a manner that the photoelectric conversion unit is not saturated in a state in which the illumination intensity is maximized, and determining the illumination intensity of the light-source unit in a state in which the photoelectric conversion unit directly reads the light of the light-source unit after the setting.

According to a fourth aspect of the present invention, there is provided an image reading method, in which a photoelectric conversion unit reads light from an original to convert the light into an image signal. The image reading method includes the steps of amplifying the image signal output from the photoelectric conversion unit, setting an electric-charge storage time of the photoelectric conversion unit to be shorter than the storage time set at the time of reading of the original, and determining an amplification factor of the amplifying step according to the level of the amplified image signal after the setting step.

In addition, according to a fifth aspect of the present invention, there is provided a computer-readable storage medium storing a processing program. This program includes the steps of illuminating an original by a light-source unit, reading light from the original to convert the light into an image signal by a photoelectric conversion unit, controlling the illumination intensity of the light-source unit in such a manner to be maximized, setting an electric-charge storage time of the photoelectric conversion unit in a manner that the photoelectric conversion unit is not saturated in a state in which the illumination intensity is maximized, and determining the illumination intensity of the light-source unit by controlling the illumination intensity in a state in which the photoelectric conversion unit directly reads the light of the light-source unit after the setting.

In addition, according to a sixth aspect of the present invention, there is provided a computer-readable storage medium storing a processing program. The program includes the steps of reading light from an original by a photoelectric conversion unit to convert the light into an image signal, amplifying the image signal, setting an electric-charge storage time of the photoelectric conversion unit to be shorter than the storage-time at the time of reading of the original, and determining an amplification factor used in the amplifying processing according to the level of the image signal after the setting.

With the above-described arrangements, the apparatus and the method for reading an image, and the computer-readable storage medium can be provided in which the CCD photoelectric conversion region can effectively be used and gray balance of the RGB color signals can be adjusted.

Further objects, features and advantages of the present invention will be clarified from the following description of the preferred embodiments with reference to the attached drawings.

DESCRIPTION OF THE PREFERRED EMBODIMENTS

The embodiments of the present invention will be illustrated with reference to drawings.

Figure 1:
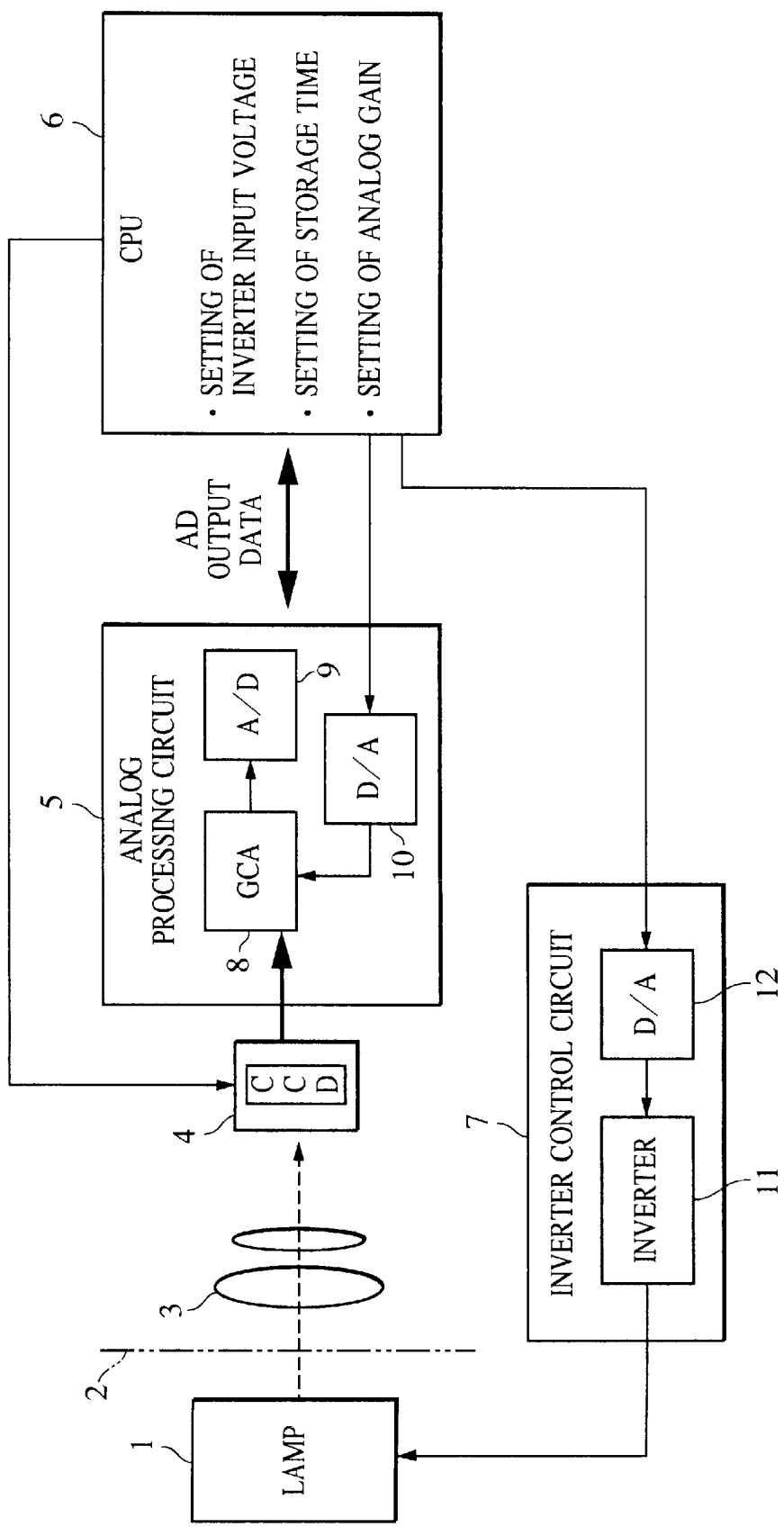
FIG. 1 is a block diagram of an image reading apparatus.

FIG. 1 is a block diagram of an image reading apparatus according to an embodiment of the present invention. In this figure, reference numeral 1 denotes a lamp. An inverter 11 lights the lamp 1 to control the illumination intensity of the lamp 1. The output voltage of the inverter 11 is controlled by a command from a CPU 6 via a D/A converter 12. Reference numeral 7 denotes an inverter control circuit including the inverter 11 and the D/A converter 12. Reference numeral 3 denotes a group of lenses, and reference numeral 2 denotes an original to be read, through which light is transmitted, such as a film. Reference numeral 4 denotes a charge-coupled device (CCD).

Reference numeral 5 denotes an analog processing circuit for processing an image signal sent from the CCD 4. Reference numeral 8 denotes a gain control amplifier (hereinafter referred to as a GCA) for amplifying the image signal, reference numeral 10 denotes a D/A converter for controlling an amplification factor of the GCA 8, and reference numeral 9 denotes an A/D converter for performing A/D conversion of the image signal. Reference numeral 6 denotes a CPU for giving commands to the D/A converter 10 included in the analog processing circuit 5 and the D/A converter 12 included in the inverter control circuit 7.

Next, an operational description of the image reading apparatus, which is a scanner, will be given below.

Light transmitted through the original 2 from the lamp 1 is collected by the lenses 3 and is photoelectrically converted by the CCD 4. In this situation, the saturation voltage of the CCD 4 is 3V and the linear region of the photoelectric conversion of the CCD 4 extends up to 2.5V. With the assumption that the A/D converter 9 has a 10 bit-resolution, further description of the scanner will be given as follows.

After the scanner is turned on, the CPU 6 sets a certain initial value of the analog gain of the GCA 8. This initial value shows an analog gain for controlling an image signal level so as to be set at 1023 of the full-range output of the A/D converter 9, when the saturation voltage of the CCD 4, which is 3V in this case, is input to the analog processing circuit 5. When the analog gain is set, the initial value of an input voltage of the inverter 11 is simultaneously set to light the lamp 1, which is hold in a standby state until the luminance thereof becomes stable. The initial value of the inverter input voltage is equal to an intermediate value in a variable voltage range set for the inverter input voltage.

After stabilization of the luminance of the lamp 1, the electric-charge storage time of the CCD 4 is set to be half as much as that set when the original 2 is read. Under this condition, the inverter control circuit 7 controls the inverter 11 to change the luminance of the lamp 1. At the same time, by referring to changes in A/D output data of the A/D converter 9 included in the analog processing circuit 5, the inverter input voltage is adjusted in a manner that, of RGB color channels, the color channel, for which the output value of the A/D converter 9 is the largest, has a value of 533 (the 10-bit resolution and the 1023 full-range output).

After the illumination intensity of the lamp 1 is determined, by controlling the analog gain of the GCA 8, analog gains of the remaining channels are set in a manner that the A/D-output values of all of the RGB signals are equal to 533. In other words, by increasing and decreasing the analog gain of the GCA 8 with a D/A output of the D/A converter 10 of the analog processing circuit 5, analog gains of the RGB channels are individually adjusted so as to keep the balance between the RGB signals amplified.

Figure 2:
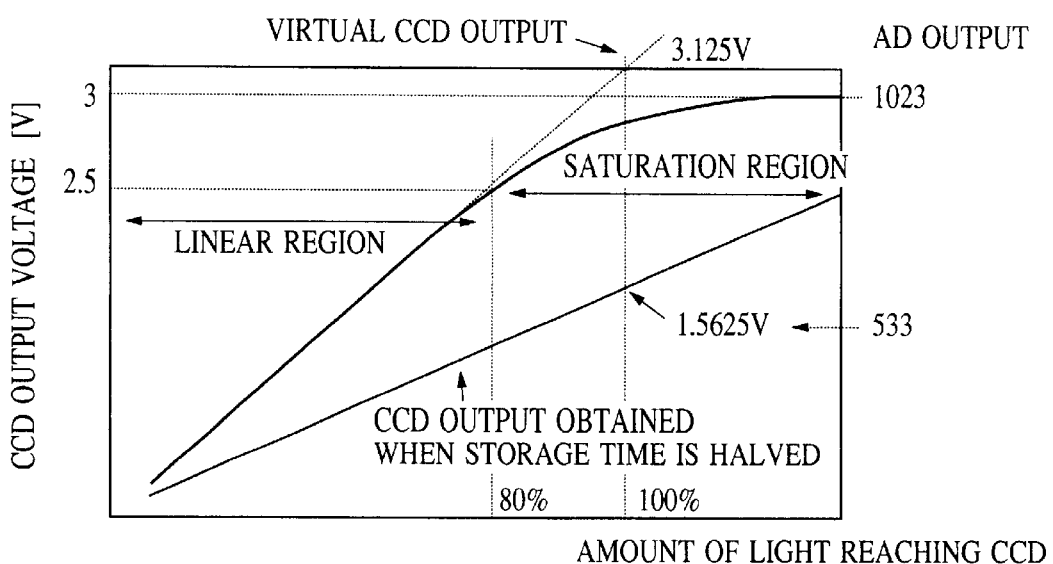
FIG. 2 is a characteristic chart showing the relationship between a CCD photoelectric conversion range and an A/D converter output.

A description will be given of a target value 533 with reference to FIG. 2. FIG. 2 shows a graph illustrating the relationship between the CCD photoelectric conversion range and outputs of the A/D converter 9.

In this figure, the linear region in the photoelectric conversion range of the CCD 4 extends up to 2.5V. Under the condition, a goal is set in which when an original with the maximum transmittance of 80% is inserted, the inverter 11 is controlled in a manner that light from the point of the transmittance 80% is converted into an output signal of 2.5 V by the CCD 4.

However, when no original to be read is present, that is, in a case of the transmittance 100%, with the same electric-charge storage time as that set when the original is read, the CCD output exceeds 3 V, which is the saturation voltage of the CCD 4. In the region such as a non-linear region in the photoelectric conversion range of the CCD 4, since a CCD output signal does not change linearly with respect to the changes in the luminance of the lamp 1, it is impossible to achieve the goal described above by controlling the inverter 11 based on A/D output data obtained from a direct light of the lamp 1.

Meanwhile, it is possible to assume that, under the condition for achieving the above goal, a virtual CCD output signal obtained from light from an original with the transmittance 100% is 3.125 V. When the electric-charge storage time of the CCD 4 is halved, the output thereof is 1.5625 V. Therefore, when the light from the original with the transmittance 100%, that is, direct light from the lamp 1 is photoelectrically converted by halving the electric-charge storage time of the CCD 4 to be amplified by using the aforementioned analog gain and then is AD-converted, an obtained A/D output value is 533.

As described above, when the storage time is reset to be the same as that set at the time of reading the original after controlling the illumination intensity of the lamp 1, the CCD 4 is eventually saturated in the case of the original with the transmittance 100%, that is, in the case of the direct light from the lamp 1. In contrast, it is evident that photoelectric conversion can be performed by using the entire photoelectric conversion range extended up to 2.5 V in the case of the original with the transmittance 80%. Naturally, since the range extended up to 2.5 V is equivalent to the linear region in the photoelectric conversion range of the CCD 4, no loss in gray balance occurs.

In this case, first, of the RGB color channels, the channel, for which the output value of the A/D converter 9 is the largest, is used to determine the illumination intensity of the light source. After that, the analog gains of the remaining color channels are adjusted in consideration for white correction. As a result, although the point of the transmittance 80% is equivalent to 853 at the 10-bit value, this can be adjusted at an arbitrary level by changing the analog gains of the RGB channels at the same ratio.

The above-described control is provided on the precondition that the maximum transmittance of an original with a positive image is approximately 80%. If deterioration of the lamp 1 prevents the A/D output from reaching the target value 533 even though the input voltage of the inverter 11 is set at the maximum value of the variable output range, white correction is performed in such a manner that the lamp 1 is lit at the maximum value of the inverter control range and the analog gain of the GCA 8 is increased so as to adjust the output to the target value 533. With an original with the transmittance of 80% or below, it is certain that image data of the original, through which light is transmitted, can be obtained by using the linear region in the CCD photoelectric conversion range.

As shown here, in this embodiment, the luminance of the lamp can be adjusted by simulating the case in which the original is inserted before the original is actually inserted. In other words, with no original inserted, the luminance of the lamp can be adjusted to the level of transmittance 120%, while being adjustable to the upper end of the linear region in the CCD photoelectric conversion range in the case of the original with the transmittance 80%. In this case, when a normal storage time is set, no illumination-intensity adjustment can be made, since the CCD 4 and an input-stage amplifier of the analog processing circuit 5 are saturated.

Therefore, the embodiment above described will be summarized as follows:

(1) The image reading apparatus used in the embodiment includes the inverter control circuit 7 capable of adjusting an inverter input voltage for determining the illumination intensity of the lamp 1, and the transmitting system capable of controlling the inverter control circuit 7 via the CPU 6. In this situation, the electric-charge storage time is set to be shorter than normal in such a manner that the CCD 4 is not saturated even when the illumination intensity of the lamp 1 is maximized. Under this condition, in the inverter control circuit 7, an inverter input voltage is changed so that the illumination intensity of the lamp 1 is changed. Since the CCD 4 is used in the linear region which is far from the saturation region, the CCD output level changes linearly with respect to the changes in the illumination intensity. Since the CCD output level obtained when the storage time is reset to be the same as that set at the time of scanning can be predicted, the illumination intensity is determined by a simulation for obtaining an output level at which the CCD 4 is not saturated in that situation.

Accordingly, in this embodiment, when the CCD output signal level at the time of self-correcting differs from that at the time of scanning, the illumination intensity of the lamp, which can effectively use the CCD photoelectric conversion range, can be determined according to each image reading apparatus, with no influence from variations in the sensitivity of the CCD and variations in the luminance of the lamp. As a result, degradation of a S/N ratio caused by unnecessary increase in the analog gain can be prevented.

(2) When adjustment of gray balance is performed, the electric-charge storage time of the CCD is set to be shorter than normal such that the CCD is not saturated even when the illumination intensity of the lamp is maximized, and under this condition, analog gains of the RGB channels are individually obtained so as to keep the balance between the RGB signals.

Therefore, in the embodiment, when a signal level set at the time of adjustment of the gray balance differs from that set at the time of scanning, with no need for inserting a correction film, the analog gains of the RGB color channels necessary to keep the gray balance can individually be determined.

That is, in this embodiment, since a signal at a specified transmittance can be adopted, regardless of saturation of the CCD and the circuits and a non-linear region near the saturation region, the illumination-intensity adjustment and adjustment of the gray balance can be made. In addition, since the CCD is not saturated, even though increasing/decreasing of the illumination intensity and the analog gain are performed, the CCD output linearly changes, with the result that the illumination-intensity adjustment is facilitated.

A description will be given of a computer-readable storage medium according to another embodiment of the present invention.

The apparatus of the present invention may be formed by hardware, or alternatively, may be formed by a computer system comprised of a CPU and a memory unit. In the latter case, the memory unit forms the storage medium in accordance with the present invention.

That is, the storage medium storing a program code of software for performing the operations described in the aforementioned embodiment is used in the system or the apparatus. The CPU of the system or the apparatus reads out the program code stored in the storage medium to run the program so as to achieve the purpose of the present invention.

In addition, as the storage medium, for example, a semiconductor memory such as ROM or RAM, an optical disk, an optical magnetic disk, or a magnetic medium may be used. They may be used by being formed into a CD-ROM, a floppy disk, a magnetic medium, a magnetic card, a non-volatile memory card, or the like.

Furthermore, the storage medium may be used in other systems and apparatuses, besides the system or the apparatus as shown in FIG. 1. In this case, when the system or the computer reads out the program code stored in the storage medium to run the program, the same functions and advantages as those provided in the above embodiment can be obtained, with the result that the purpose of the present invention can be achieved.

Furthermore, for example, when an operating system running in the computer performs a part of processing or the entire processing, the same function and advantages as those provided in the above embodiment can also be obtained, the purpose of the present invention can thereby be achieved, similar to a case in which the program code read out from the storage medium is written into a memory unit incorporated on an expansion board inserted in the computer or an expansion unit connected to the computer, and after this, based on the command of the program code, for example, a CPU incorporated on the expansion board or the expansion unit performs a part of the processing or the entire processing.

In addition, as the lamp as the light source used in the invention, for example, it is possible to use an incandescent lamp such as a fuse lamp or a halogen lamp, or a fluorescent lamp such as an electrodeless rare gas lamp, a hot cathode fluorescent lamp, a cold cathode fluorescent lamp, or a semi-hot lamp. Furthermore, alternatively, a lamp having a light source such as an LED, a gas laser, a semiconductor laser (LD), or electroluminescence may be used to obtain the same advantages as those shown in the above embodiment.

In addition, by simulating the case in which the original is inserted before it is actually inserted, the illumination intensity of the lamp, which is capable of effectively using the CCD photoelectric conversion range, can be set. In this case, with no influence from variations in the sensitivity of the CCD and variations in the luminance of the lamp, the illumination intensity of the lamp can be set according to individual objects. With this arrangement, degradation of the S/N ratio due to the unnecessary increase in the analog gain can be prevented.

In addition, in the present invention, when the signal level set at the time of adjustment of gray balance differs from that set at the time of scanning, without inserting a correction film or the like, analog gains of RGB color channels, which are required to keep gray balance, can individually be set.

While the present invention has been described with reference to what are presently considered to be the preferred embodiments, it is to be understood that the invention is not limited to the disclosed embodiments, and is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image reading apparatus comprising:

light-source means for illuminating an original to be read;

photoelectric conversion means for reading light from the original to convert the light into an image signal;

illumination-intensity controlling means for controlling illumination intensity of the light-source means;

setting means for setting an electric-charge storage time of the photoelectric conversion means in a manner that the photoelectric conversion means is not saturated in a state in which the illumination intensity of the light-source means is maximized by the illumination-intensity controlling means; and first determining means for determining the illumination intensity of the light-source means by controlling the illumination-intensity controlling means in a state in which the photoelectric conversion means directly reads the light of the light-source means after setting of the electric-charge storage time by the setting means.

2. An image reading apparatus according to claim 1, further comprising second determining means for determining the illumination intensity of the light-source means in a manner that the photoelectric conversion means is saturated when the electric-charge storage time at the time of reading of the original is set in the photoelectric conversion means to directly read the light of the light-source means.

3. An image reading method, in which light-source means illuminates an original and photoelectric conversion means reads light from the original to convert the light into an image signal, the method comprising the steps of:

controlling the illumination intensity of the light-source means in such a manner to be maximized;

setting an electric-charge storage time of the photoelectric conversion means in a manner that the photoelectric conversion means is not saturated in the state in which the illumination intensity is maximized; and determining the illumination intensity of the light-source means in a state in which the photoelectric conversion means directly reads light of the light-source means after the setting.

4. An image reading method according to claim 3, further comprising a step of determining the illumination intensity of the light-source means in a manner that the photoelectric conversion means is saturated when the electric-charge storage time at the time of reading of the original is set in the photoelectric conversion means to directly read the light of the light-source means.

5. A computer-readable storage medium storing a processing program comprising the steps of:

illuminating an original by light-source means;

reading light from the original to convert the light into an image signal by photoelectric conversion means;

controlling the illumination intensity of the light-source means in such a manner to be maximized;

setting an electric-charge storage time of the photoelectric conversion means in a manner that the photoelectric conversion means is not saturated in a state in which the illumination intensity is maximized; and determining the illumination intensity of the light-source means by controlling the illumination intensity in a state in which the photoelectric conversion means directly reads the light of the light-source means after the setting.

6. A computer-readable storage medium storing a processing program according to claim 5, further comprising a step of determining the illumination intensity of the light-source means in a manner that the photoelectric conversion means is saturated when the electric-charge storage time at the time of reading of the original is set in the photoelectric conversion means to directly read the light of the light-source means.

* * * * *